United States Patent
Adachi

(10) Patent No.: US 7,210,925 B2
(45) Date of Patent: May 1, 2007

(54) HEAT TREATMENT JIG FOR SILICON SEMICONDUCTOR SUBSTRATE

(75) Inventor: Naoshi Adachi, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 23 days.

(21) Appl. No.: 11/039,968

(22) Filed: Jan. 24, 2005

(65) Prior Publication Data

US 2005/0282101 A1    Dec. 22, 2005

(30) Foreign Application Priority Data

Jun. 21, 2004    (JP)    .............................. 2004-182160

(51) Int. Cl.
    *F27D 5/00*    (2006.01)
(52) U.S. Cl. ...................... 432/253; 211/41.18; 118/725
(58) Field of Classification Search ................ 432/253, 432/258, 81, 5; 211/41.18; 219/443.1; 118/725, 118/729
    See application file for complete search history.

(56) References Cited

U.S. PATENT DOCUMENTS

| | | | |
|---|---|---|---|
| 5,820,367 A * | 10/1998 | Osawa | 432/253 |
| 6,099,302 A * | 8/2000 | Hong et al. | 432/259 |
| 6,793,734 B2 * | 9/2004 | Takagi | 118/715 |
| 6,796,439 B2 * | 9/2004 | Araki | 211/41.18 |
| 2004/0040632 A1 | 3/2004 | Oosterlaken | |

FOREIGN PATENT DOCUMENTS

| | | |
|---|---|---|
| JP | 09-199438 | 7/1997 |
| JP | 10-242067 | 9/1998 |
| JP | 2001-060559 | 3/2001 |
| JP | 2003-100648 | 4/2003 |
| JP | 2003-197722 | 7/2003 |
| JP | 2003-249458 | 9/2003 |
| JP | 2004-134761 | 4/2004 |

* cited by examiner

*Primary Examiner*—Gregory A. Wilson
(74) *Attorney, Agent, or Firm*—Clark & Brody

(57) ABSTRACT

A heat treatment jig for supporting silicon semiconductor substrates by contacting, being loaded onto a heat treatment boat in a vertical heat treatment furnace, comprises; the configuration of a ring or a disc structure with the wall thickness between 1.5 and 6.0 mm; the deflection displacement of 100 μm or less at contact region in loaded condition; the outer diameter which is 65% or more of the diameter of said substrate; and the surface roughness (Ra) of between 1.0 and 100 μm at the contact region. The use of said jig enables to effectively retard the slip generation and to avoid the growth hindrance of thermally oxidized film at the back surface of said substrate, diminishing the surface steps causing the defocus in photolithography step in device fabrication process, thereby enabling to maintain high quality of silicon semiconductor substrates and to substantially enhance the device yield.

17 Claims, 8 Drawing Sheets

HEAT TREATMENT JIG FOR SILICON SEMICONDUCTOR SUBSTRATE

BACKGROUND OF THE INVENTION

1. Field of the Invention

The present invention relates to a heat treatment jig that is used in a heat treatment boat of a vertical heat treatment furnace, and in more detail, to a heat treatment jig for silicon semiconductor substrates that can retard the generation of slips as crystal defects during heat treatment at high temperature and can prevent the generation of surface steps attributable to the growth hindrance of the thermally oxidized film which generates at the back surface of said silicon semiconductor substrates when being held in oxidizing atmosphere in high temperature heat treatment.

2. Description of the Related Art

A silicon semiconductor substrate that is processed in LSI device fabrication process, in fabrication steps such as oxidation, diffusion, film deposition and the like, is repeatedly subjected to high temperature heat treatment.

In heat treatment of silicon semiconductor substrates, a vertical heat treatment furnace can reduce an installation space and is suitable for simultaneous heat treatment of a large quantity of semiconductor substrates with large diameter; accordingly, it is adopted as an apparatus to be used in various heat treatments of semiconductor substrates.

FIG. 1 is a diagram showing a configuration example of a heat treatment boat for silicon semiconductor substrates that is used in a vertical heat treatment furnace. A heat treatment boat 1 includes three pillars 3 or more along with top and bottom panels 5, 6 that fix said pillars 3 at top and bottom positions, and is provided with an opening segment 2. The pillars 3 are provided with substrate support means 4, so that, after the silicon semiconductor substrates are charged from the opening segment 2 on the substrate support means 4, the boat is inserted into the vertical heat treatment furnace, being followed by predetermined heat treatment.

As shown in FIG. 1, a heat treatment boat 1 is constituted of a pair of top and bottom panels 5, 6 disposed with a space and a plurality of pillars 3 that link these top and bottom panels; accordingly, an opening segment 2 is indispensably provided to charge the silicon semiconductor substrates on the substrate support means 4 or to discharge those therefrom. Accordingly, two pillars 3 disposed at the opening segment 2, in order to facilitate charging or discharging of silicon semiconductor substrates, are normally put in place with a space equivalent to the diameter of silicon semiconductor substrate.

During high temperature heat treatment at 1100° C. or more in above-mentioned vertical heat treatment furnace for silicon semiconductor substrates, when an in-plane temperature distribution becomes inhomogeneous in silicon semiconductor substrates, the generation of thermal stress is accompanied in silicon semiconductor substrates. Further, depending on a supporting method for silicon semiconductor substrates, owing to its own weight of wafer (substrate), the stress (hereinafter referred to simply as "tare stress") happens to be generated.

In conventional heat treatment boat, when a silicon semiconductor substrate is merely supported at its periphery portion and the silicon semiconductor substrate with 300 mm diameter is heat treated, the tare stress is markedly generated, resulting in causing difficulty to be used.

It is well known that the thermal stress and the tare stress develop crystal defects, which are called the slips, in the silicon semiconductor substrate during heat treatment. As the slips cause an increase in the leakage current of the LSI device and deteriorate the planarity of silicon semiconductor substrate, there has been proposed by many to suppress the thermal and tare stress in view of quality control of silicon semiconductor substrates up to date.

For instance, in Japanese Patent Application Laid-open Publication No. 10-242067 and in Japanese Patent Application Laid-open Publication No. 2003-100648, a heat treatment jig having a disc structure that supports the entire back surface of silicon semiconductor substrate with a solid flat plate is disclosed. However, in this heat treatment jig having a disc structure, the local temperature difference is likely to be developed at the region where silicon substrate as a work piece to be heat treated makes plane contact with said jig, leading inadvertently to generate the slips attributable to the incurred thermal stress.

To solve above problem in the heat treatment jig having a disc structure, many proposals that adopt the heat treatment jig having a ring structure come to be made, which is represented by Japanese Patent Application Laid-open Publication No. 09-199438. In this representative, it is disclosed that silicon substrates are supported at peripheral portions of the back surface thereof in using a heat treatment jig having a ring-like tray. However, the present inventors made investigations and took note that, in using said heat treatment jig having a ring-like tray, the deflection was developed at the central portion of silicon substrate in accompany of tare stress generation, thereby the silicon substrate came to contact with the end face of inner peripheral portion in ring-like tray, resulting in generation of surface defects thereon which became the origin of slip generation.

Similarly, in Japanese Patent Application Laid-open Publication No. 2001-060559, as a countermeasure to above problem, in order to retard the generation of tare stress in silicon substrate, a heat treatment method is proposed to use the jig, wherein a first ring, which is protruded in ring-like manner, together with a second ring, which is also protruded in ring-like manner and disposed in concentric-circle shape arrangement at the outside of said first ring, support silicon substrates at the back surface thereof. However, the present inventors made investigations and noted that, as the flatness of these dual rings, namely a first ring and a second ring, was not specified, it was not possible to equally support silicon substrates and to prevent the generation of the slips.

In Japanese Patent Application Laid-open Publication No. 2003-197722, a heat treatment jig having a ring-like structure (inclusive of horseshoe-like jig) is disclosed, wherein the flatness and surface roughness are stipulated as to the contact surface, and wherein the configuration is such that a plurality of through-wall holes, which are disposed in concentric-circle shape, are provided on the support face thereof for silicon substrates, while the total section area of through-wall holes on the support face for silicon substrates is stipulated. Also in this publication, it teaches that the surface roughness Ra is preferred to be 0.1 to 0.7 μm, and so the flatness to be 50 μm or less.

However, when it comes to the heat treatment jig to be applied for silicon semiconductor substrates of 300 mm diameter, high accuracy machining is required to secure the flatness to be 50 μm or less over the entire region where the silicon substrates to sit on, which results in the cost increase and can not be practically manufacturing parameters with respect to the machining/processing accuracy.

SUMMARY OF THE INVENTION

As afore-mentioned, the thermal stress as well as the tare stress that are generated during high temperature heat treatment of silicon semiconductor substrates induce the slips therein. Thus, in order to assure the quality of silicon semiconductor substrates, various measures concerning a heat treatment jig to effectively prevent the generation of thermal stress as well as tare stress are attempted. Nonetheless, any heat treatment jig to date could not fully meet the requirement of preventing the generation of the slips.

Moreover, in association with high temperature heat treatment, the latest subject relating to the thermally oxidized film incurred by the heat treatment jig has surfaced. To be concrete, in oxidation process using a heat treatment jig for a heat treatment boat in a vertical heat treatment furnace, it is inevitable to carry out heat treatment at high temperature, for instance, at 1300° C. or higher in oxygen atmosphere with high concentration in case of SIMOX fabrication process.

Normally, when heat treated in oxygen atmosphere in such a high temperature oxidation process treatment, the thermally oxidized film with range of 0.5 to 1.0 μm in thickness grows both on top and back surface of silicon substrate. However, at the region of the back surface of silicon substrate where to come into contact with a heat treatment jig, the growth of thermally oxidized film is hindered, thus its thickness gets thinner compared to that in other region.

Accordingly, when this thermally oxidized film is removed after a high temperature oxidation process treatment, the surface steps emerge on the back surface of silicon substrate owing to the difference of thermally oxidized film thickness. The surface steps, thus generated, on the back surface of silicon substrate causes the defocus in photolithography step in device fabrication process, resulting in the significant reduction of device yield.

The present invention was made to solve above-mentioned problem in association with high temperature heat treatment for silicon semiconductor substrates and intends to provide a heat treatment jig enabling to effectively reduce the generation of the slips as well as to retard the generation of surface steps owing to the difference of developed thermally oxidized film on the back surface of said silicon substrate by applying followings; a deflection displacement of heat treatment jig in the state of being loaded onto a heat treatment boat in a vertical heat treatment furnace, is controlled; and the surface roughness at the region where to come into contact with the back surface of silicon substrate is vigorously investigated and adapted to be the proper range.

Thus, to achieve above-mentioned object, the present inventors carried out heat treatment extensively by applying for a heat treatment boat in a vertical heat treatment furnace, and made investigations as to the required configuration of heat treatment jig so that the generation of the slips is effectively retarded and the growth of thermally oxidized film is not hindered.

Conventionally, as a measure to retard the generation of the slips generation, it is perceived that it has been effective to control the flatness of heat treatment jig after machining. Accordingly, it has been stipulated that the flatness (JIS B 0621) at the region where to come into contact with silicon semiconductor substrates shall be controlled to be 100 μm or less, preferably 50 μm or less.

Nonetheless, the present inventors, without being restricted by this conventional measure, paid attention to the fact that it is necessary to control a deflection displacement which is generated in a heat treatment jig in the state of being loaded onto a heat treatment boat so as to effectively retard the generation of the slips.

FIG. 2 shows the test results of the effect of the configuration of a heat treatment jig on the deflection displacement of said heat treatment jig. Herein, the heat treatment jig for testing has a solid flat-plate structure or a ring structure, either of which is made of silicon carbide measuring 320 mm in diameter and 2 mm in thickness. And the generated deflection displacement of said heat treatment jig in the state of being loaded onto a heat treatment boat in a vertical heat treatment furnace (shown in FIG. 1 as afore-mentioned) is measured.

FIG. 3 shows the configuration of tested heat treatment jig along with supporting arrangement when it is loaded in a heat treatment boat. The configuration of a heat treatment jig 7 is set to have a solid flat-plate or a ring structure in which the diameter of center hole is altered in the range of 0 to 210 mm, and the effect by said jig on the generated deflection displacement is investigated, when the jig 7 is supported at four points in outer periphery portion thereof by substrate support means 4. Measuring are arranged to be made at the outer peripheral portion (position A) of jig for an opening segment 2 and at the center portion (position B) in case of a solid flat-plate structure, otherwise at the inner peripheral portion (position B) in case of a ring structure.

As shown in FIG. 2, in case that the center hole is not disposed in a heat treatment jig, the deflection displacement of about 30 μm is generated at the center position (position B) owing to the own weight, and further it is revealed that the deflection at the outer peripheral portion (position A), matching with the opening segment of heat treatment boat, gets to be maximum, which is about 85 μm.

Then, in case that hollow center is disposed in a heat treatment jig and its diameter is varied, the deflection displacement at the inner peripheral portion (position B) as well as at the outer peripheral portion (position A) of the jig increases as the diameter of the center hole becomes larger. For instance, in a heat treatment jig with a ring structure of 210 mm diameter center hole, the amount of deflection displacement of the jig is about 80 μm at the inner peripheral portion (position B) and about 105 μm at the outer peripheral portion (position A), which turned out to have increased by about 50 μm and 20 μm respectively.

Therefore, in order to effectively retard the generation of the slips in association with high temperature heat treatment for silicon semiconductor substrates, it is necessary to control rather the generated deflection displacement of heat treatment jig in the state of being loaded onto a heat treatment boat in a vertical heat treatment furnace, than the flatness control of heat treatment jig after being machined.

Furthermore, in relation to the growth of thermally oxidized film at the back surface of silicon semiconductor substrate during heat treatment with long duration in oxidizing atmosphere at high temperature, the growth of thermally oxidized film is hindered at the region where the heat treatment jig contacts with silicon substrate, which is notably aggravated as the contact region gets wider.

Meanwhile, the surface steps being generated on silicon substrates are very likely to affect the defocus in photolithography process. Especially, this becomes evident when producing thick oxide film by soaking for long duration at high temperature like SIMOX heat treatment.

To solve this problem, the present inventors have made research works and found that, if the surface roughness should be controlled to be 1.0 μm or more with the provision that the jig having a ring structure is used and the width of contact region thereof is 10 mm or so for example, the ingress of atmosphere gas into the crevice in contact region is induced so that the thickness of thermally oxidized film on the contact region gets equal to that on other non-contact region, or, if any, just a minimal difference occurs, satisfying the criteria of 3% or less.

While, in case that the width of contact region exceeds 10 mm, by implementing much rougher contact surface, the ingress of atmosphere gas is facilitated. Also, it was found that the disposition of slits and/or through-wall holes with equal spacing in contact region of a heat treatment jig is very effective to induce the ingress of atmosphere gas into the contact region.

The present invention is completed based on afore-mentioned study, and following description in (1) to (4) is the gist of an invented heat treatment jig for silicon semiconductor substrates.

(1) A heat treatment jig which comes into contact with silicon semiconductor substrate to support, wherein said jig is loaded onto a heat treatment boat in a vertical heat treatment furnace, comprising; the configuration of a ring structure or a solid disc structure both with the wall thickness of not less than 1.5 mm but not greater than 6.0 mm; the minimum deflection displacement of 100 μm or less at contact region with said silicon semiconductor substrate when loaded in said heat treatment boat; the outer diameter which is not less than 65% of the diameter of relevant silicon semiconductor substrate to be supported; and the surface roughness (Ra) of not less than 1.0 μm but not greater than 100 μm at the region to contact with said silicon semiconductor substrates.

(2) In case of a heat treatment jig having a ring structure as described in above (1), it is preferable that the width of the ring should be 0.5 mm or more. Meanwhile, in case that a solid disc structure is applied, it is preferable that the recessed bed is disposed at the center portion or the protruded figuration is formed at the region to contact with said silicon semiconductor substrate to be supported.

(3) Further, in a heat treatment jig described in above (1), it is preferable that, in order to avoid the growth hindrance of thermally oxidized film, either the placement of slits with predetermined spacing or the even arrangement of through-wall holes at the contact region with said silicon semiconductor substrate to be supported is made so as to facilitate the ingress of atmosphere gas into the contact surface of the heat treatment.

(4) In a heat treatment jig described in above (1), it is preferable that the support region to contact with silicon semiconductor substrate is formed by any one out of a silicon material, a silicon material deposited by a silicon carbide film, and a silicon carbide material.

By using a heat treatment jig for silicon semiconductor substrates according to the present invention, with the provision that the generated deflection displacement of said heat treatment jig in the state of being loaded onto a heat treatment boat in a vertical heat treatment furnace is marginally controlled and the surface roughness of the region to contact with the back surface of said silicon semiconductor substrate is specified, it becomes possible to effectively retard the generation of the slips and to avoid the growth hindrance of thermally oxidized film, leading to diminish the surface steps which should cause the defocus in photolithography step of device fabrication process. Thus, it becomes possible to maintain high quality of silicon semiconductor substrates as well as to enhance a device yield substantially.

BRIEF DESCRIPTION OF THE DRAWINGS

FIG. 4A shows the heat treatment jig having a disc structure that is underpinned by pillars, and FIGS. 4B through 4D show the heat treatment jig having a ring structure that is underpinned by pillars.

FIGS. 5A and 5C show the heat treatment jig each having a solid disc structure that is underpinned by pillars, and FIGS. 5B and 5D show the heat treatment jig each having a ring structure that is underpinned by pillars.

FIGS. 6A and 6C show the constitution of the heat treatment jig having a cylindrically recessed bed at the center portion of said jig, and FIGS. 6B and 6D show the constitution of the heat treatment jig having a spherically recessed bed at the center portion of said jig.

FIG. 7A shows a plan view of the heat treatment jig, and FIGS. 7B and 7C show the front view of cross-section indicated by X—X of the heat treatment jig on which the silicon semiconductor substrate sits.

DETAILED DESCRIPTION OF THE PREFERRED EMBODIMENTS

A heat treatment jig according to the present invention is specified such that; said jig comes into contact with silicon semiconductor substrates to be supported; said jig is loaded onto a heat treatment boat in a vertical heat treatment furnace; said jig has the configuration of a ring structure or a solid disc structure both with the wall thickness of not less than 1.5 mm but not greater than 6.0 mm; said jig entails the minimum deflection displacement of 100 μm or less at contact region with said silicon semiconductor substrates when loaded in said heat treatment boat; and said jig is made so that the surface roughness (Ra) is not less than 1.0 μm but not greater than 100 μm at the region to contact with said silicon semiconductor substrates.

Figure 4A:
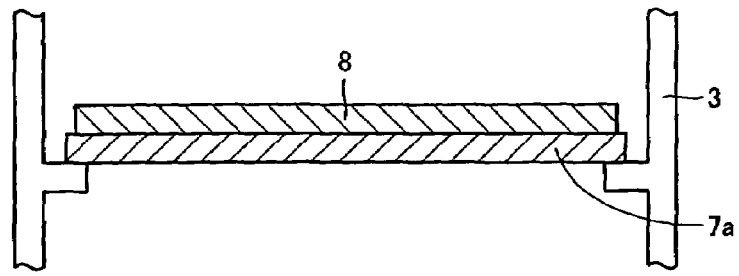
FIGS. 4A through 4D are diagrams to explain constitution examples of heat treatment jig according to the present invention.
Figure 4B:
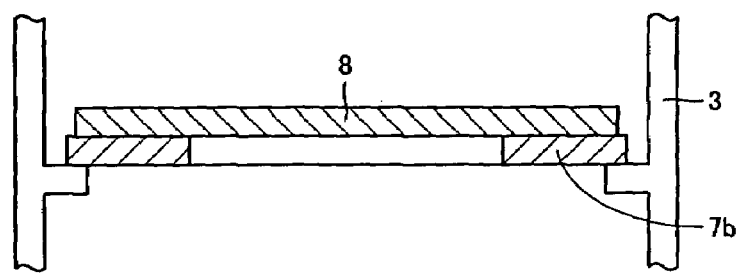
Figure 4C:
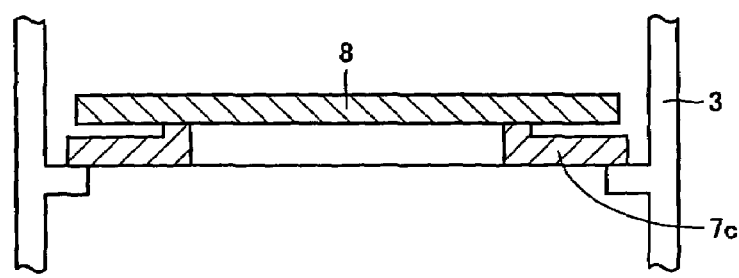
Figure 4D:
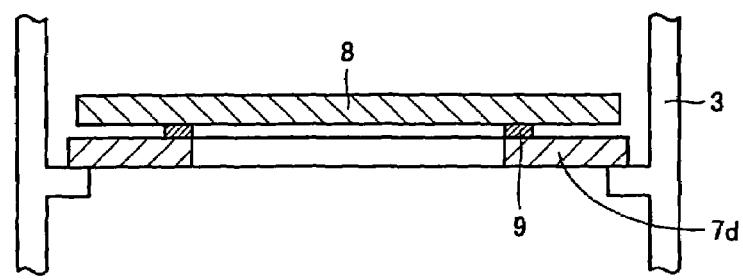

FIGS. 4A through 4D are diagrams to explain constitution examples of heat treatment jig according to the present invention. FIG. 4A shows the heat treatment jig having a disc structure that is underpinned by pillars, and FIGS. 4B through 4D show the heat treatment jigs 7b, 7c, 7d having a ring structure that is underpinned by pillars.

Each heat treatment jig shown in FIGS. 4A through 4D is designed to have the structure with the diameter equivalent to or greater than the diameter of silicon substrate. In particular, the jig 7a with a solid disc structure can reduce the amount of generated deflection displacement thereof in the state of being loaded onto a heat treatment boat. But, as the jig should contact with entire back surface of silicon substrate 8 by nature of its structure, the heat capacity increases, resulting in adversely affecting heat-up and cooling profile, which is likely to decrease the productivity in consequence.

In this case, when the region to contact with the back surface of silicon substrate 8 needs to be narrowed, as being described later, the recessed bed can be disposed at the center portion or a protruded figuration can be formed at the region to contact with silicon substrates to be supported.

Meanwhile, in the jig 7b with a ring structure, it is possible that the heat capacity be smaller than that in the jig 7a with a solid disc structure. Further, in the jig 7c with a ring structure, a protruded figuration is formed at the region to contact with the back surface of silicon substrate 8, while a dual structure having another ring member 9 of narrow width is constituted on the base ring in the jig 7d with a ring structure. By adopting these jigs 7c, 7d with a ring structure, it is possible to further reduce the temperature difference due to contact with silicon substrates.

Figure 5A:
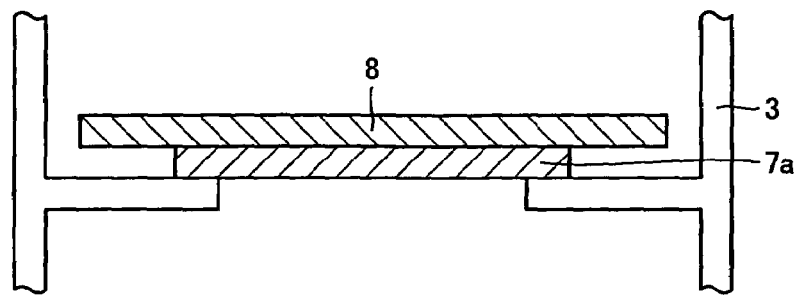
FIGS. 5A through 5D are diagrams showing other constitution examples of heat treatment jig according to the present invention.
Figure 5B:
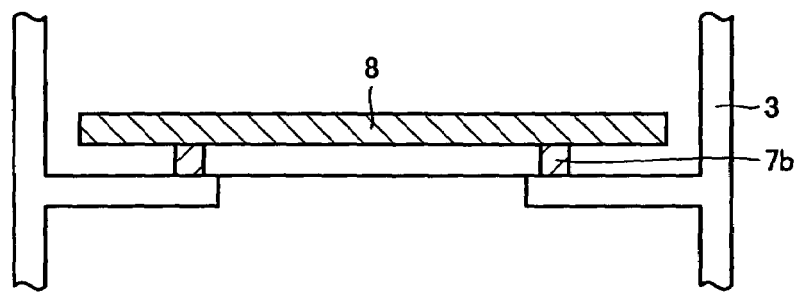
Figure 5C:
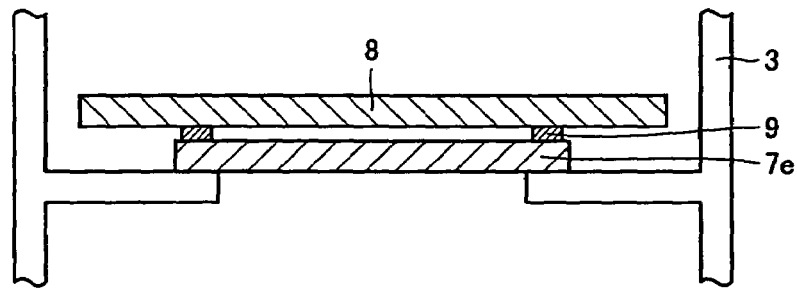
Figure 5D:
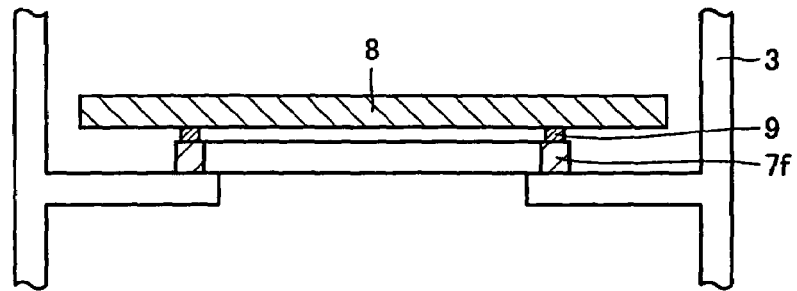

FIGS. 5A through 5D are diagrams showing other constitution examples of heat treatment jig according to the present invention. FIGS. 5A and 5C show the heat treatment jigs 7a, 7e with a solid disc structure that is underpinned by pillars 3, and FIGS. 5B and 5D show the heat treatment jigs 7b, 7f with a ring structure that is underpinned by pillars 3.

Each heat treatment jig shown in FIGS. 5A through 5D has the structure with the diameter smaller than that of silicon substrate, and the heat capacity thereof can be smaller than that of either jig shown in FIGS. 4A through 4D, leading to be advantageous in view of productivity in heat treatment. To further reduce the temperature difference due to contact with silicon substrates 8, a dual structure having a ring member 9 of narrow width formed on the base disc is adopted in the jig 7e with a solid disc structure shown in FIG. 5C, while a dual structure having a ring member 9 of narrow width formed on the base ring is adopted in the jig 7f with a ring structure shown in FIG. 5D.

For heat treatment jigs shown in FIGS. 5A through 5D, as being described later, it is possible either to form the recessed bed at the center portion, or to form a protruded structure at the region to contact with silicon substrates, and it is also possible to combine both said figuration.

In a heat treatment jig according to the present invention, the wall thickness thereof is specified to be not less than 1.5 mm but not greater 6 mm. In general, the thickness of the jig is inversely proportionate with an amount of generated deflection displacement thereof. Therefore, by securing the wall thickness of not less than 1.5 mm, it becomes possible to reduce the generated deflection displacement to be predetermined criteria or lower.

On the other hand, as the wall thickness increases, the heat capacity thereof gets larger, resulting in deteriorating heat-up and cooling profile as well as reducing the productivity because of being obliged to charge fewer silicon substrates for heat treatment. Thus, the upper limit of the wall thickness is specified to be 6 mm. In actual operation, as several tens of heat treatment jigs are loaded in a heat treatment furnace, the wall thickness is preferable to be not less than 1.8 mm but not greater than 4.0 mm.

In addition, in a heat treatment jig according to the present invention, an amount of generated deflection displacement of the jig at the occasion of loading onto a heat treatment boat is stipulated to be 100 μm or less. This stipulation is based on the results of afore-mentioned investigations, that is, it becomes necessary to reduce the amount of generated deflection displacement of the jig in the state of being loaded onto a heat treatment boat in order to effectively retard the generation of the slips during heat treatment, in place of controlling the flatness of heat treatment jig after machining.

If the amount of generated deflection displacement should exceed 100 μm, the contact between the heat treatment jig and silicon semiconductor substrates is likely to be confined to points, which is so-called point contact. This point contact leads to instable supporting of the silicon substrate and the slips generate from the point of contacting owing to its own weight of silicon substrate. Therefore, it becomes necessary to limit the amount of generated deflection displacement of the jig in the state of being loaded onto a heat treatment boat to be 100 μm or less, more preferably to be 50 μm or less.

In a heat treatment jig according to the present invention, the surface roughness of the jig surface to contact with silicon semiconductor substrates is stipulated to be 0.1 μm or more, but 100 μm or less at the most. Incidentally, the surface roughness stipulated in the present invention is designated by centerline average roughness (Ra value) defined in JIS B 0601.

The reason for above is that, when the surface roughness should be less than 0.1 μm, the ingress of atmosphere gas into the region of the jig to contact with semiconductor silicon substrates gets least, in addition that the jig surface likely adheres to silicon substrates after high temperature heat treatment as mentioned before.

In this connection, in case that the surface roughness happens to be less than 0.1 μm, it becomes necessary to make the surface rougher to some extent by adopting blasting method using either silica granule or silicon carbide granule, or by printing tool mark of machining apparatus or turning lathe, thereby finally securing the surface roughness (Ra value) of 0.1 μm or more.

Meanwhile, although it is possible to make the jig surface rough by machining or lathe turning, the upper limit of the roughness (Ra value) is stipulated to be 100 μm from the view point of productivity along with yield in machining.

In a heat treatment jig according to the present invention, the diameter of the jig to contact with silicon semiconductor substrates for supporting is stipulated to be not less than 65% of the diameter of said silicon semiconductor substrates, wherein the configuration is made to be either a ring structure or a solid disc structure. Herein, the upper limit of the jig diameter is preferably to be set as 75% of the diameter of said silicon semiconductor substrates. In the mean time, concerning the jig configuration, either a solid disc structure or a ring structure can be adopted as long as it can stably support said silicon semiconductor substrates.

In a heat treatment jig according to the present invention, it is preferable that the width of ring is 0.5 mm or more in case of a ring structure. As shown in above FIGS. 4A through 4D and FIGS. 5A through 5D, by adopting a ring structure, the surface area to contact with silicon substrates can be further smaller than that with a solid disc structure, which is effective to prevent the generation of the slips due to the contact of the jig with silicon substrates. However, if the width of the ring should be less than 0.5 mm, the accurate machining/processing becomes difficult. Therefore, the width of the ring is specified to be 0.5 mm or more.

In a heat treatment jig according to the present invention, it is preferable, in case of a solid disc structure, that a recessed bed is formed at the center portion thereof, otherwise a protruded figuration is formed at the region where to contact with said silicon semiconductor substrates to be supported. This is because, by doing above, it becomes possible to reduce the heat capacity even in case of a solid disc structure, as well as to adjust the region, where to contact with said silicon semiconductor substrates to be supported, to the optimal range.

Figure 6A:
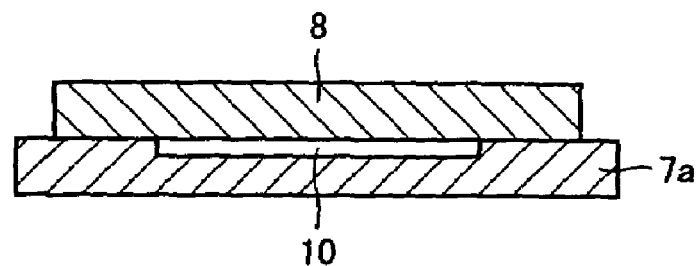
FIGS. 6A through 6D are diagrams showing constitution examples of heat treatment jig that has a solid disc structure with the recessed bed.
Figure 6B:
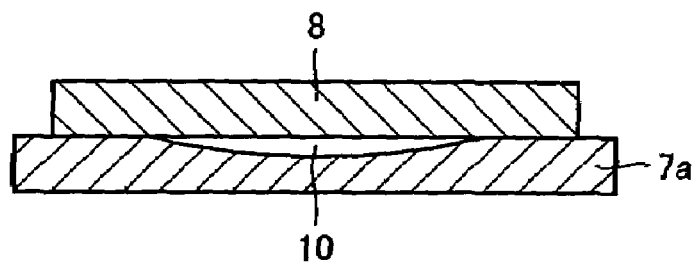
Figure 6C:
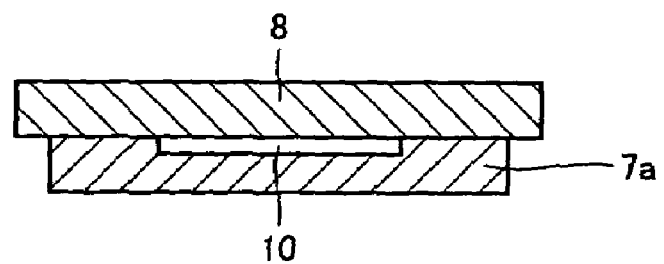
Figure 6D:
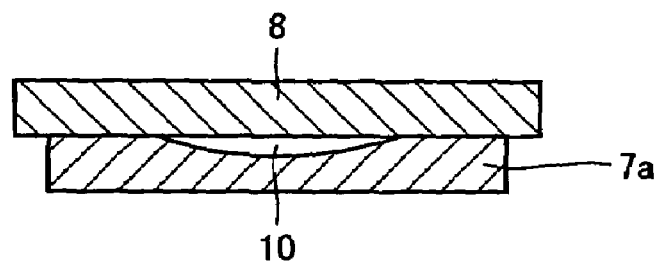

FIGS. 6A through 6D are diagrams showing constitution examples of heat treatment jig that has a solid disc structure with a recessed bed. FIG. 6A shows the constitution of the heat treatment jig having a cylindrically recessed bed 10 at its center portion in case that the jig diameter is larger than that of silicon substrate. Likewise, FIG. 6B shows the constitution of the heat treatment jig having a spherically recessed bed 10 at its center portion in case that the jig diameter is larger than that of silicon substrate. FIG. 6C shows the constitution of the heat treatment jig having a cylindrically recessed bed 10 at its center portion in case that the jig diameter is smaller than that of silicon substrate. Likewise, FIG. 6D shows the constitution of the heat treatment jig having a spherically recessed bed 10 at its center portion in case that the jig diameter is smaller than that of silicon substrate.

Although either type of recessed bed 10 in above can be adopted, it is preferable that the maximum diameter of recessed bed is set to be about 65% of the diameter of relevant silicon substrates, in case that the recessed bed 10 is made on the top surface of the jig. In a heat treatment jig according to the present invention, the case that the recessed bed 10 is made at the back surface of the jig is also included without limiting to the case that the recessed bed 10 is made on the top surface of the jig.

Figure 7A:
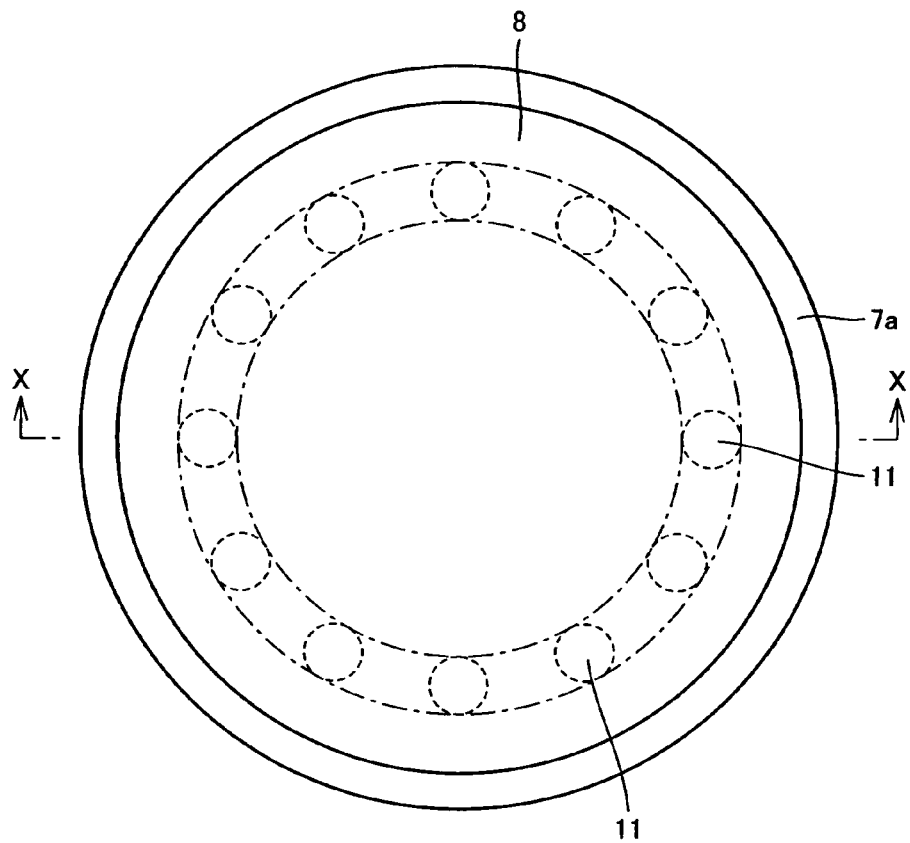
FIGS. 7A through 7C are diagrams to explain constitution examples of heat treatment jig having a disc structure or a ring structure in which the protruded figuration is formed at the region to contact with the silicon semiconductor substrate to be supported.
Figure 7B:
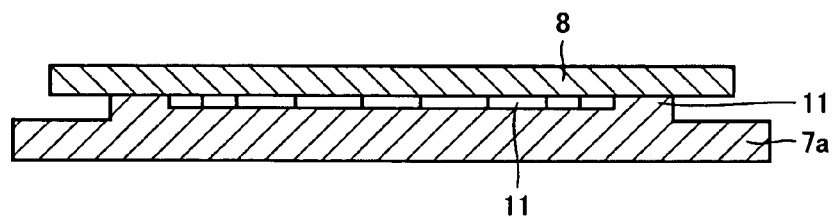
Figure 7C:
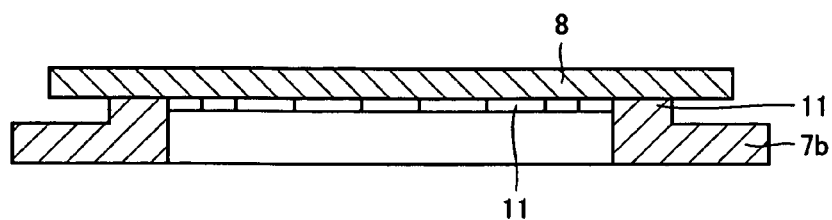

FIGS. 7A through 7C are diagrams to explain constitution examples of heat treatment jig having either a disc structure or a ring structure in which the protruded figuration is formed at the region to contact with the silicon semiconductor substrate to be supported. FIG. 7A shows a plan view of the heat treatment jig, and FIG. 7B shows the front view of cross-section indicated by X—X of the heat treatment jig 7a having a solid disc structure on which the silicon semiconductor substrate sits. FIG. 7C shows the front view of cross-section indicated by X—X of the heat treatment jig 7b having a ring structure on which the silicon semiconductor substrate sits. In the constitutions shown in FIGS. 7A through 7C, the protruded figuration 11 is formed in concentric-circle shape arrangement so that the region to contact with the silicon semiconductor substrate is set to be not less than 65% of the diameter of said silicon substrate to be supported.

With regard to the configuration of the protruded figuration, it is not limited to the case shown in FIGS. 7A through 7C, but other configuration can be adopted. For instance, the circumradius from the center of the jig 7a to the circumcircle of protruded figuration 11 can be sequentially enlarged, or it is also allowable that the small diameter protruded figuration 11 is disposed between each of the large diameter portions of protruded figuration 11 in concentric-circle shape arrangement.

In a heat treatment jig according to the present invention, it is preferable that either the disposition of slits with predetermined spacing or the disposition of through-wall holes in even manner is made at the region, where to contact with the silicon substrate to be supported, so as to induce the ingress of atmosphere gas into the surface of heat treatment jig in order to avoid the growth hindrance of thermally oxidized film at the region where to contact with the silicon substrate to be supported.

As afore-mentioned, when the surface roughness is controlled to be 1.0 μm or more with the provision that the width of the region to contact with the silicon substrate is about 10 mm, the ingress of atmosphere gas from the crevice at the contact region becomes possible. In case that the width of the region to contact with the silicon substrate exceeds 10 mm, it can be done that the surface is made rougher within the specified value of 100 μm or less. That being the case, as a more preferable embodiment, it is possible to dispose slits or through-wall holes at the contact region in order to undergo the ingress of atmosphere gas into the contact region.

Figure 8:
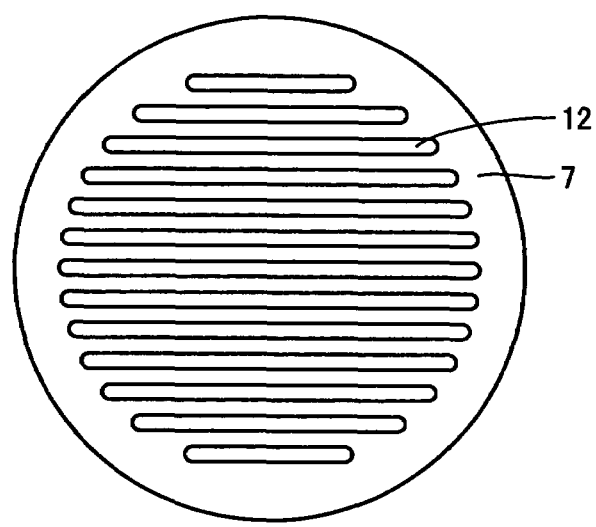
FIG. 8 is a diagram showing a heat treatment jig having slits that enable the ingress of atmosphere gas into the contact region thereof.

FIG. 8 is a diagram showing a heat treatment jig having slits that enable the ingress of atmosphere gas into the contact region thereof. As a concrete dimensional condition, it can be exemplified that the depth of slits 12 is 0.2 mm or more and the spacing between each slit 12 is 1 mm or more.

Figure 9:
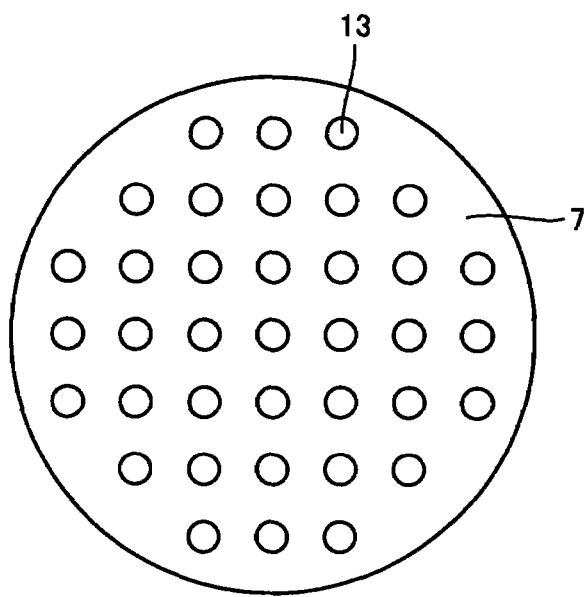
FIG. 9 is a diagram showing a heat treatment jig having through-wall holes that enable the ingress of atmosphere gas into the contact region thereof.

FIG. 9 is a diagram showing a heat treatment jig having through-wall holes that enable the ingress of atmosphere gas into the contact region thereof. When the through-wall holes 13 are disposed, it is preferred that the diameter of through-wall hole is 1 mm or more and the spacing between each through-wall hole is 1 mm or more, being disposed evenly.

In a heat treatment jig according to the present invention, the base material of the region to contact with silicon semiconductor substrates can be made of a silicon material or a silicon carbide material. The hardness of both materials at the region to contact with silicon substrates is equivalent to or softer than that of silicon, thereby enabling to further retard the generation of the slip.

In case that a silicon material is adopted, it can be done that a silicon carbide (SiC) film is deposited on the surface made of a silicon material. By covering with high purity SiC, the contamination of silicon semiconductor substrates can be reduced.

EXAMPLES

Figure 1:
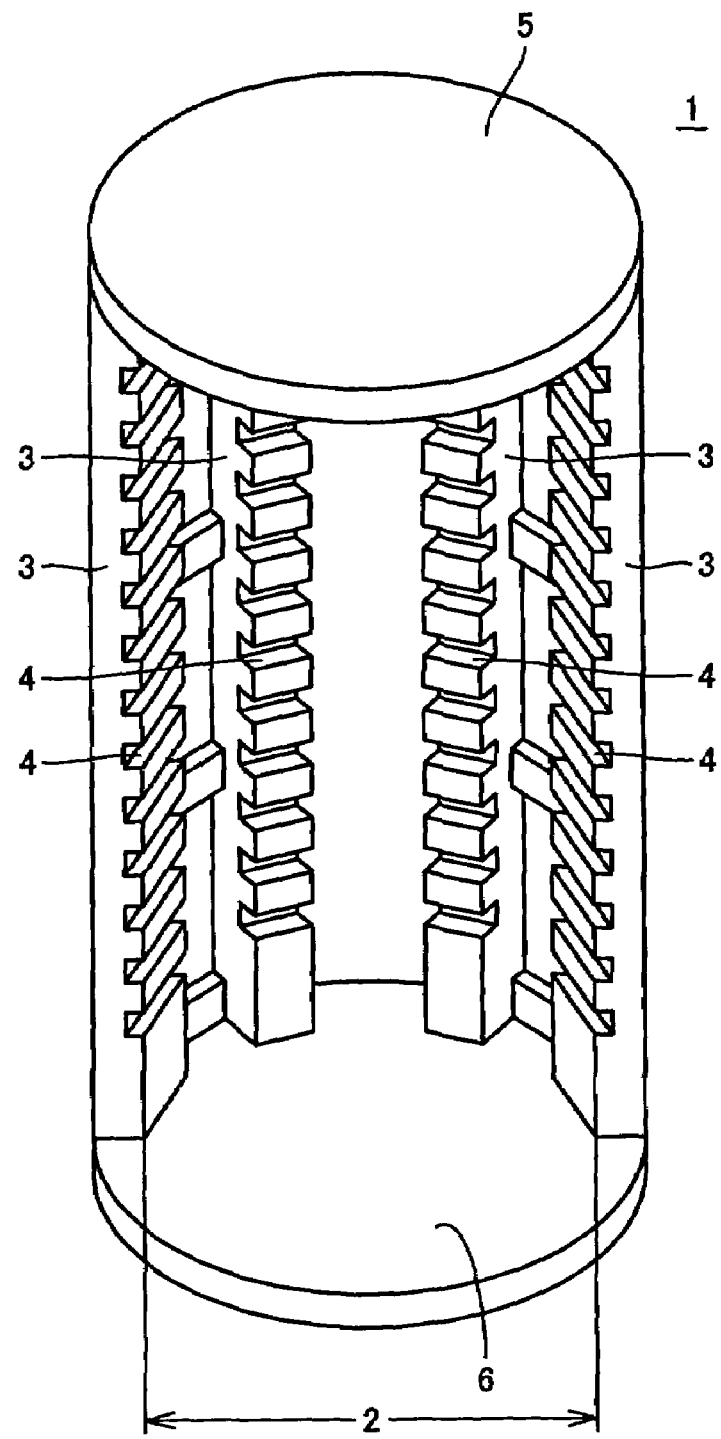
FIG. 1 is a diagram showing a configuration example of a heat treatment boat for silicon semiconductor substrates that is used in a vertical heat treatment furnace.
Figure 2:
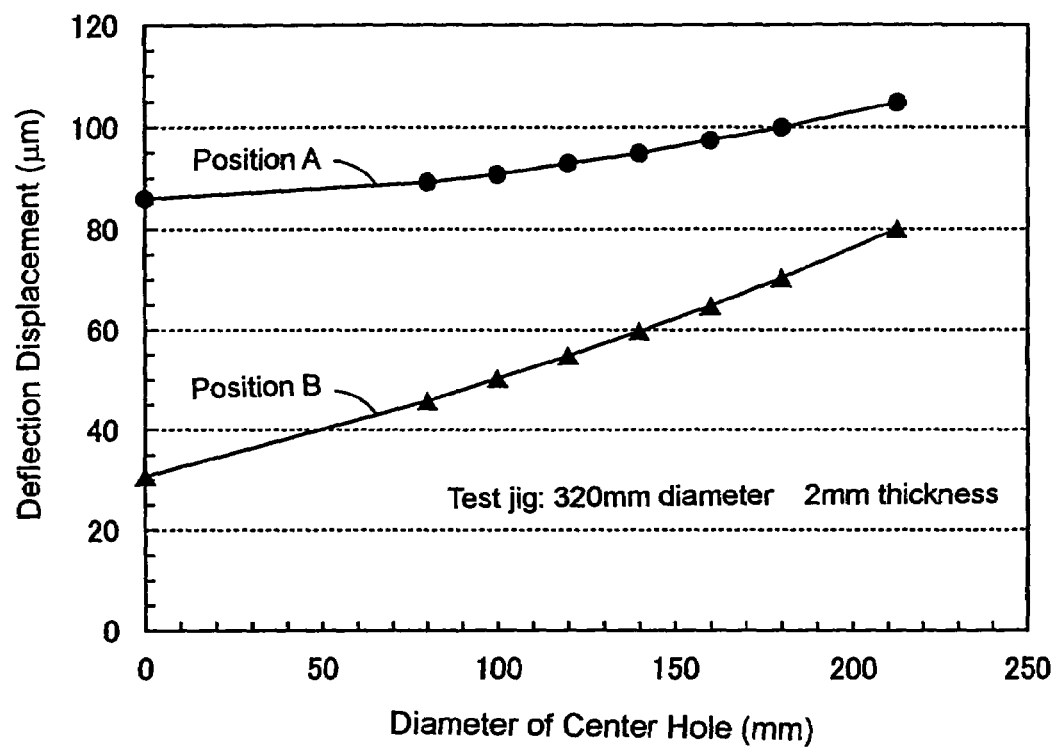
FIG. 2 is a diagram showing the test results of the effect of the configuration of a heat treatment jig on the deflection displacement of said heat treatment jig.
Figure 3:
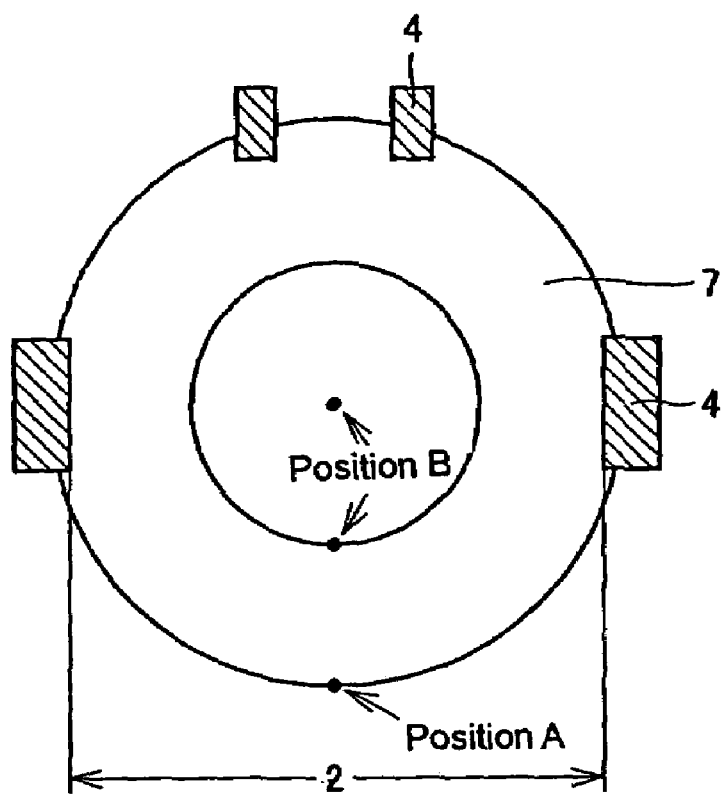
FIG. 3 is a diagram showing the configuration of tested heat treatment jig along with supporting arrangement when it is loaded onto a heat treatment boat.

In order to examine the effect of a heat treatment jig according to the present invention, various types of heat treatment jig, wherein the jig configuration, the wall thickness, the amount of generated deflection displacement at the occasion of being loaded onto a heat treatment boat, the surface roughness (Ra value), and the like are variable, are prepared and loaded onto a heat treatment boat shown in afore-mentioned FIG. 1, which is subjected to bear the load at four outer peripheral positions, in a vertical heat treatment furnace for checking its performance in each heat treatment.

Example 1

For confirmatory purpose of the proper wall thickness of the jig, three jigs each having a solid disc structure made of silicon carbide (SiC) were prepared as for the jigs of Inventive example No. 1, wherein the detail is set as follows; the diameter of 319 mm; the wall thickness of 1.5 mm; the amount of generated deflection displacement of 40 μm to 60 μm; and the surface roughness of 1.5 μm to 1.7 μm.

Similarly, as for the jigs of Comparative example No. 1, three jigs each having a solid disc structure made of silicon carbide (SiC) were prepared, wherein the detail parameter is set as follows; the diameter of 319 mm; the wall thickness of 0.9 mm; the amount of generated deflection displacement of 50 μm to 80 μm; and the surface roughness of 1.4 μm to 1.7 μm.

Silicon substrates of 300 mm diameter were charged onto these heat treatment jigs and heat treated in argon gas atmosphere in a vertical heat treatment furnace with the pattern as follows; heat-up rate of 5° C./min from 600° C. to 1000° C. and then 3° C./min up to 1200° C.; holding 1 hr at 1200° C.; and cooling rate of 3° C./min down to 600° C. After heat treatment, silicon substrates were examined for the slip by using magic mirror apparatus.

It was observed that, while thin cross-shaped slips were generated at the inner region for silicon substrates tested by the jig of Inventive example No. 1, the large slips were generated for silicon substrates tested by the jig of Comparative example No. 1 at the region to match the bearing points by the boat at its opening segment.

From this result, it was confirmed that the large slips were generated in case of the thin wall thickness jig like Comparative example No. 1 that is out of the range specified by the present invention, even if an amount of the generated deflection displacement should be within the range specified by the present invention.

Example 2

As the jigs of Inventive example No. 2, fifty (50) jigs each having a solid disc structure made of SiC were prepared, wherein the detail parameter is set as follows; the diameter of 319 mm; the wall thickness of 2.0 mm; the amount of the generated deflection displacement of 30 μm to 60 μm; and the surface roughness of 1.5 μm to 2.0 μm.

The prepared jigs of Inventive example No. 2 were loaded onto the vertical heat treatment boat with a pitch of 12 mm and were heat treated exactly in the same manner with Example 1. After the heat treatment, silicon substrates were examined for the slip by using a mirror magic apparatus, observing that the slips were generated at the peripheral portions for almost all silicon substrates.

Next, the same jigs of Inventive example No. 2 were loaded onto the vertical heat treatment boat with a pitch of 12 mm and were heat treated in similar manner to Example 1 except that the heating and cooling rate in the range from 1000° C. to 1200° C. was reduced to 1.5° C./min. After the heat treatment, silicon substrates were examined for the slip and it was found that the generated slips at the peripheral portions were substantially decreased.

Further, as the jigs of Inventive example No. 3, through-wall holes were drilled in the region of 220 mm diameter around the center portions to the jigs of above Inventive example No. 2. The prepared jigs thus as of Inventive example No. 3 were loaded onto the vertical heat treatment boat with a pitch of 12 mm and were heat treated exactly in the same manner with Example 1. After the heat treatment, the silicon substrates were examined for the slip and it was found that about four to twelve slips for almost all silicon substrates were generated at the region to match with the end face of the inner peripheral portion of the ring.

However, it was confirmed that, by using the jigs of Inventive example No. 3 having through-wall holes, the thermal stress to be incurred to silicon substrates was reduced and the generated slips were substantially decreased, compared to the case that used the jigs of Inventive example No. 2.

Example 3

Further, by utilizing the remaining jigs that through-wall holes were disposed in above Example 2, the jigs of Inventive example Nos. 4 through 6 were prepared.

First, as the jigs of Inventive example No. 4, ten (10) jigs each having a solid disc structure made of SiC were prepared, wherein the detail parameter is set as follows; the diameter of 210 mm; the wall thickness of 1.8 mm; the amount of the generated deflection displacement of 30 μm to 60 μm; and the surface roughness of 2.1 μm to 2.3 μm.

Next, as the jigs of Inventive example No. 5, ten (10) jigs each having a ring structure made of SiC were prepared, wherein the detail parameter is set as follows; the diameter of 210 mm; the inside diameter of 205 mm; the wall thickness of 1.8 mm; the amount of the generated deflection displacement of 30 μm to 60 μm; and the surface roughness of 2.1 μm to 2.2 μm.

Further, as the jigs of Inventive example No. 6, ten (10) jigs each having a ring structure made of SiC were prepared, wherein the detail parameter is set as follows; the diameter of 210 mm; the inside diameter of 200 mm; the wall thickness of 1.8 mm; the amount of the generated deflection displacement of 30 μm to 60 μm; and the surface roughness of 2.0 μm to 2.3 μm.

The silicon substrates of 300 mm diameter were charged on these three types of jigs as Inventive example Nos. 4 through 6, and were heat treated exactly in the same manner with Example 1. After the heat treatment, the silicon substrates were examined and a satisfactory result was obtained such that several thin slips were merely generated for all silicon substrates charged on any jig.

Example 4

In order to examine the change of deflection displacement in association with the repetition of heat treatment, the jigs of Inventive example No. 7 each having a solid disc structure made of polycrystal silicon were prepared, wherein the detail parameter is set as follows; the diameter of 210 mm; the wall thickness of 1.8 mm; the amount of the generated deflection displacement of 20 μm to 40 μm; and the surface roughness of 2.1 μm to 2.3 μm.

Using the prepared jigs of Inventive example No. 7, silicon substrates were heat treated with SIMOX heat treatment condition as heating temperature of 1350° C. and holding time of 10 hours. Argon gas containing 3% of oxygen was used as atmosphere gas for the heat treatment. After the heat treatment, the silicon substrates were examined and it was found that several thin slips were merely generated.

Also, using the jigs of Inventive example No. 7, the heat treatment was carried out three to five times. As the number of repetition of heat treatment increased, the generation of the slips augmented and the amount of generated deflection displacement in the state of being loaded onto the heat treatment boat at the last heat treatment in series became 200 μm to 400 μm. Therefore, in order to prevent the generation of the slips, it is necessary at each heat treatment to check the amount of generated deflection displacement in the state of being loaded onto the heat treatment boat whether to be within the range specified by the present invention.

Meanwhile, with regard to the life span of the jig, it was examined that the life span of the jig could be prolonged by increasing the wall thickness to maximum 6 mm or so, since the stiffness can be enhanced by increasing the jig wall thickness.

Example 5

Similarly, in order to examine the change of deflection displacement in association with the repetition of heat treatment, the jigs of Inventive example No. 8 were prepared by modifying the composition to silicon material in the jigs of Inventive example No. 5 each having a ring structure that were used in Example 3 (the diameter of 210 mm; the inside diameter of 205 mm; the wall thickness of 1.8 mm; the amount of the generated deflection displacement of 30 μm to 60 μm; and the surface roughness of 2.1 μm to 2.2 μm).

Next, each of prepared jigs of Inventive example No. 8 was stacked onto each of the heat treatment jigs having a ring structure made of SiC, wherein the detail parameter is set as follows; the diameter of 319 mm; the inside diameter of 200 mm; the wall thickness of 1.5 mm; the amount of generated deflection displacement of 50 μm; and the surface roughness of 2.0 μm to 2.2 μm. And then, the heat treatment was carried out repetitively in the same manner with Example 4. After the completion of repetitive heat treatments, silicon substrates were examined for the slip generation, and a satisfactory result was obtained regarding the slip generation such that no marked increase of the slips due to the repetitive heat treatments was discerned.

Example 6

In order to examine the behavior with respect to the growth hindrance of thermally oxidized film on the silicon substrate, each of the jigs of Inventive example No. 7 (having a solid disc structure made of silicon material, wherein the detail parameter is set as follows; the diameter of 210 mm; the wall thickness of 1.8 mm; the amount of generated deflection displacement of 20 μm to 40 μm; and the surface roughness of 2.1 μm to 2.3 μm) that were used in above Example 4 was stacked onto each of the jigs of Inventive example No. 2 (having a solid disc structure made of silicon, wherein the detail parameter is set as follows; the diameter of 319 mm; the wall thickness of 2.0 mm; the amount of generated deflection displacement of 30 μm to 60 μm; and the surface roughness of 1.5 μm to 2.0 μm) that were used in above Example 2.

Similarly, each of the jigs of Inventive example No. 8 (having a ring structure made of silicon, wherein the detail parameter is set as follows; the diameter of 210 mm; the inside diameter of 205 mm; the wall thickness of 1.8 mm; the amount of generated deflection displacement of 30 μm to 60 μm; and the surface roughness of 2.1 μm to 2.2 μm) that were used in above Example 5 was stacked onto each of the jigs of Inventive example No. 2 that were used in Example 2.

Accordingly, silicon substrates of 300 mm diameter were charged onto the jigs of both Inventive example No. 7 (the jig of a solid disc structure) and Inventive example No. 8 (the jig of a ring structure) that were stacked at the top, and were subjected to SIMOX heat treatment. The condition of said SIMOX heat treatment was similar to that in Example 4, where heating temperature is 1350° C. and holding time is 10 hours, except that the oxygen content in atmosphere gas was changed to 50%.

After measuring the thickness of thermally oxidized film that was developed at the surface of the silicon substrates that were subjected to said SIMOX heat treatment, the thickness of thermally oxidized film at the back surface of the substrate turned out to be about 990 nm. The thickness of said film at the back surface that did not contact with the jig was also about 990 nm.

However, the thickness of thermally oxidized film at the region to contact with the jigs of Inventive example No. 7 (having a solid disc structure) reduced to the level of about 980 nm in the region ranging from the edge of the contact to about 10 mm and further reduced to the level of about 935 nm toward the center portion of silicon substrate. Meanwhile, the thickness of said thermally oxidized film at the region to contact with the jigs of Inventive example No. 8 (having a ring structure) did not show any significant variation.

Example 7

In order to examine the effectiveness of the disposition of slits or through-wall holes in terms of avoiding the growth hindrance of thermally oxidized film, as the jigs of Inventive example No. 9, the jigs each having a solid disc structure made of SiC were prepared, wherein the detail parameter is set as follows; the diameter of 210 mm; the wall thickness of 1.8 mm; the amount of generated deflection displacement of 40 μm; and the surface roughness of 2.6 μm), and wherein the slits of 0.5 mm in depth and 3.0 mm in width were disposed with spacing of 5.0 mm on the surface thereof.

Similarly, as the jigs of Inventive example No. 10, the jigs each having a solid disc structure made of SiC were prepared, wherein the detail parameter is set as follows; the diameter of 210 mm; the wall thickness of 1.8 mm; the amount of generated deflection displacement of 40 μm; and the surface roughness of 2.6 μm), and wherein the through-wall holes of 3.0 mm in diameter were disposed with spacing of 7.5 mm on the surface thereof.

By using the prepared jigs of both Inventive example Nos. 9 and 10, silicon substrates were subjected to SIMOX heat treatment. After measuring the thickness of thermally oxidized film that was developed at the surface of the silicon substrates that were subjected to the heat treatment, it turned out that, in either case of using jigs of Inventive example No. 9 or No. 10, no decrease of the thickness of thermally oxidized film even at the region to contact with the jigs was observed, forming uniform film thickness of about 980 nm to 990 nm on top and back surface of silicon substrates, which results in less than 3% in terms of the variation of film thickness.

What is claimed is:

1. A heat treatment jig which comes into contact with silicon semiconductor substrates to be supported, wherein said jig is loaded onto a heat treatment boat in a vertical heat treatment furnace, comprising;
   a configuration of a ring structure or a solid disc structure both with the wall thickness of not less than 1.5 mm but not greater than 6.0 mm;
   a deflection displacement of 100 μm or less at the contact region with said silicon semiconductor substrate when loaded in said heat treatment boat;
   an outer diameter which is not less than 65% of the diameter of relevant silicon semiconductor substrate to be supported; and
   a surface roughness (Ra) of not less than 1.0 μm but not greater than 100 μm at the region to contact with said silicon semiconductor substrates.

2. A heat treatment jig for silicon semiconductor substrates according to claim 1, wherein said jig has the configuration of a ring structure and a ring width of the ring structure is not less than 0.5 mm.

3. A heat treatment jig for silicon semiconductor substrates according to claim 2, comprising slits disposed with predetermined spacing at the region to contact with said silicon semiconductor substrates to be supported.

4. A heat treatment jig for silicon semiconductor substrates according to claim 2, comprising through-wall holes evenly disposed at the region to contact with said silicon semiconductor substrates to be supported.

5. A heat treatment jig for silicon semiconductor substrates according to claim 2, comprising the contact region, which contact with said silicon semiconductor substrates to be supported, made of any one out of a silicon material, a silicon material deposited by a silicon carbide film, and a silicon carbide material.

6. A heat treatment jig for silicon semiconductor substrates according to claim 1, wherein a recessed bed is formed at the center of said jig in case that said jig has the configuration of a solid disc structure.

7. A heat treatment jig for silicon semiconductor substrates according to claim 6, comprising slits disposed with predetermined spacing at the region to contact with said silicon semiconductor substrates to be supported.

8. A heat treatment jig for silicon semiconductor substrates according to claim 6, comprising through-wall holes evenly disposed at the region to contact with said silicon semiconductor substrates to be supported.

9. A heat treatment jig for silicon semiconductor substrates according to claim 6, comprising the contact region, which contact with said silicon semiconductor substrates to be supported, made of any one out of a silicon material, a silicon material deposited by a silicon carbide film, and a silicon carbide material.

10. A heat treatment jig for silicon semiconductor substrates according to claim 1, wherein a protruded figuration is formed at the region to contact with said silicon semiconductor substrates to be supported in case that said jig has the configuration of a solid disc structure.

11. A heat treatment jig for silicon semiconductor substrates according to claim 10, comprising slits disposed with predetermined spacing at the region to contact with said silicon semiconductor substrates to be supported.

12. A heat treatment jig for silicon semiconductor substrates according to claim 10, comprising through-wall holes evenly disposed at the region to contact with said silicon semiconductor substrates to be supported.

13. A heat treatment jig for silicon semiconductor substrates according to claim 10, comprising the contact region, which contact with said silicon semiconductor substrates to be supported, made of any one out of a silicon material, a silicon material deposited by a silicon carbide film, and a silicon carbide material.

14. A heat treatment jig for silicon semiconductor substrates according to claim 1, comprising slits disposed with predetermined spacing at the region to contact with said silicon semiconductor substrates to be supported.

15. A heat treatment jig for silicon semiconductor substrates according to claim 14, comprising the contact region, which contact with said silicon semiconductor substrates to be supported, made of any one out of a silicon material, a silicon material deposited by a silicon carbide film, and a silicon carbide material.

16. A heat treatment jig for silicon semiconductor substrates according to claim 1, comprising through-wall holes evenly disposed at the region to contact with said silicon semiconductor substrates to be supported.

17. A heat treatment jig for silicon semiconductor substrates according to claim 1, comprising the contact region, which contact with said silicon semiconductor substrates to be supported, made of any one out of a silicon material, a silicon material deposited by a silicon carbide film, and a silicon carbide material.

* * * * *